United States Patent
Saji

(10) Patent No.: US 10,574,211 B2
(45) Date of Patent: Feb. 25, 2020

(54) COMPOSITE FILTER DEVICE

(71) Applicant: Murata Manufacturing Co., Ltd., Nagaokakyo-shi, Kyoto-fu (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 76 days.

(21) Appl. No.: 16/052,672

(22) Filed: Aug. 2, 2018

(65) Prior Publication Data

US 2018/0375492 A1    Dec. 27, 2018

Related U.S. Application Data

(63) Continuation of application No. PCT/JP2017/008532, filed on Mar. 3, 2017.

(30) Foreign Application Priority Data

Mar. 16, 2016  (JP) ................. 2016-052433

(51) Int. Cl.
*H03H 9/72*    (2006.01)
*H03H 9/64*    (2006.01)
(Continued)

(52) U.S. Cl.
CPC ........ *H03H 9/725* (2013.01); *H03H 9/02535* (2013.01); *H03H 9/02559* (2013.01);
(Continued)

(58) Field of Classification Search
CPC .... H03H 9/58; H03H 7/0153; H03H 9/02559; H03H 9/0576; H03H 9/1071;
(Continued)

(56) References Cited

U.S. PATENT DOCUMENTS

| | | | | |
|---|---|---|---|---|
| 4,752,709 A | * | 6/1988 | Fujishima | H03H 9/1452 310/313 A |
| 5,965,969 A | | 10/1999 | Kadota | |
| 6,259,186 B1 | * | 7/2001 | Shibata | H03H 9/02543 310/313 A |
| 2010/0060102 A1 | | 3/2010 | Goto et al. | |

(Continued)

FOREIGN PATENT DOCUMENTS

| | | |
|---|---|---|
| JP | 09-205337 A | 8/1997 |
| JP | 2010-088109 A | 4/2010 |

(Continued)

OTHER PUBLICATIONS

Official Communication issued in International Patent Application No. PCT/JP2017/008532, dated May 23, 2017.

*Primary Examiner* — Benny T Lee
*Assistant Examiner* — Hafizur Rahman
(74) *Attorney, Agent, or Firm* — Keating & Bennett, LLP

(57) ABSTRACT

A composite filter device for use in carrier aggregation includes a first bandpass filter connected to an antenna common terminal and including a first pass band, and a second bandpass filter including a second pass band of a higher frequency than the first pass band. The first bandpass filter includes an $LiNbO_3$ substrate, an IDT electrode which is provided on the $LiNbO_3$ substrate and defines the first bandpass filter, and a dielectric film which covers the IDT electrode and includes silicon oxide as a main component. The first bandpass filter is defined by at least one elastic wave resonator, and a Rayleigh wave propagating in the $LiNbO_3$ substrate is used and an acoustic velocity of a Sezawa wave in the elastic wave resonator is equal to or higher than about 4643.2 m/sec.

20 Claims, 7 Drawing Sheets

(51) Int. Cl.
*H03H 9/145* (2006.01)
*H03H 9/02* (2006.01)
*H03H 9/25* (2006.01)

(52) U.S. Cl.
CPC ........ *H03H 9/145* (2013.01); *H03H 9/14541* (2013.01); *H03H 9/25* (2013.01); *H03H 9/6483* (2013.01); *H03H 9/6489* (2013.01); *H03H 9/72* (2013.01)

(58) Field of Classification Search
CPC .... H03H 9/542; H03H 9/6409; H03H 9/6436; H03H 9/6483; H03H 9/725; H01L 41/047; H01L 41/0533; H01L 41/183
USPC ......................................................... 333/195
See application file for complete search history.

(56) References Cited

U.S. PATENT DOCUMENTS

| | | | |
|---|---|---|---|
| 2013/0300519 A1 | 11/2013 | Tamasaki et al. | |
| 2013/0314173 A1* | 11/2013 | Inoue | H03H 9/70 333/133 |
| 2015/0069882 A1* | 3/2015 | Umeda | H03H 9/02574 310/313 B |

FOREIGN PATENT DOCUMENTS

| | | |
|---|---|---|
| JP | 2012-175315 A | 9/2012 |
| JP | 2014-135624 A | 7/2014 |
| WO | 2012/098816 A1 | 7/2012 |
| WO | 2014/208145 A1 | 12/2014 |

* cited by examiner

COMPOSITE FILTER DEVICE

CROSS REFERENCE TO RELATED APPLICATIONS

This application claims the benefit of priority to Japanese Patent Application No. 2016-052433 filed on Mar. 16, 2016 and is a Continuation Application of PCT Application No. PCT/JP2017/008532 filed on Mar. 3, 2017. The entire contents of each application are hereby incorporated herein by reference.

BACKGROUND OF THE INVENTION

1. Field of the Invention

The present invention relates to a composite filter device including an interdigital transducer (IDT) electrode provided on an $LiNbO_3$ substrate and utilizing a Rayleigh wave.

2. Description of the Related Art

In a duplexer described in Japanese Unexamined Patent Application Publication No. 2012-175315, a transmission filter and a reception filter are connected to an antenna terminal. The transmission filter utilizes a Rayleigh wave propagating in an $LiNbO_3$ substrate. This transmission filter is formed by a ladder filter including a plurality of elastic wave resonators. An $SiO_2$ film is provided so as to cover IDT electrodes of the respective elastic wave resonators.

In recent years, a carrier aggregation system has been used in cellular phones and the like. In the carrier aggregation system, at least two bandpass filters having different frequency bands are connected to a common antenna terminal.

When the existing bandpass filter utilizing the Rayleigh wave as described in Japanese Unexamined Patent Application Publication No. 2012-175315 is used for a duplexer, there is no problem. However, when the existing bandpass filter utilizing the Rayleigh wave as described in Japanese Unexamined Patent Application Publication No. 2012-175315 is used in the above-described carrier aggregation system or the like, a Sezawa wave which is a high-order mode of the Rayleigh wave appears around a frequency of approximately 1.2 times the frequency of the Rayleigh wave. There has been a possibility that a response of the Sezawa wave becomes an unwanted wave that adversely affects the bandpass filter having a higher frequency band.

SUMMARY OF THE INVENTION

Preferred embodiments of the present invention provide composite filter devices capable of effectively reducing or preventing an adverse effect due to a response of a Sezawa wave on a bandpass filter having a higher frequency band as its pass band.

According to a preferred embodiment of the present invention, a composite filter device to be used for carrier aggregation includes an antenna common terminal that is connected to an antenna, a first bandpass filter that is connected to the antenna common terminal and has a first pass band, and a second bandpass filter that is connected to the antenna common terminal and has a second pass band of a higher frequency than the first pass band, wherein the first bandpass filter includes an $LiNbO_3$ substrate, an IDT electrode which is provided on the $LiNbO_3$ substrate and defines the first bandpass filter, and a dielectric film which covers the IDT electrode on the $LiNbO_3$ substrate and includes silicon oxide as a main component, the first bandpass filter includes at least one elastic wave resonator, and a Rayleigh wave propagating in the $LiNbO_3$ substrate is utilized and an acoustic velocity of a Sezawa wave in the elastic wave resonator is equal to or higher than about 4643.2 m/sec.

In a composite filter device according to a preferred embodiment of the present invention, the first bandpass filter is a ladder filter including series arm resonators and parallel arm resonators, and at least one of the series arm resonators and the parallel arm resonators is defined by the elastic wave resonator.

In a composite filter device according to a preferred embodiment of the present invention, at least one of the series arm resonators is defined by the elastic wave resonator.

In a composite filter device according to a preferred embodiment of the present invention, the ladder filter is connected to the antenna common terminal, and the series arm resonator closest to the antenna common terminal is defined by the elastic wave resonator.

In a composite filter device according to a preferred embodiment of the present invention, the first bandpass filter further includes a longitudinally coupled resonator elastic wave filter connected to the ladder filter.

In a composite filter device according to a preferred embodiment of the present invention, the longitudinally coupled resonator elastic wave filter is connected to the ladder filter at an opposite side to the antenna common terminal.

In a composite filter device according to a preferred embodiment of the present invention, the first bandpass filter further includes another ladder filter connected to the longitudinally coupled resonator elastic wave filter as the elastic wave resonator at an opposite side to the ladder filter.

In a composite filter device according to a preferred embodiment of the present invention, a third bandpass filter having a third pass band is further connected to the first bandpass filter at an opposite side to the antenna common terminal.

In a composite filter device according to a preferred embodiment of the present invention, the first bandpass filter includes a longitudinally coupled resonator elastic wave filter as the elastic wave resonator.

In a composite filter device according to a preferred embodiment of the present invention, the IDT electrode includes a first metal film including, as a main component, one metal among W, Pt, Cu, and Mo.

In a composite filter device according to a preferred embodiment of the present invention, a second metal film which is laminated on the first metal film and has a lower electric resistance than the first metal film is provided.

In a composite filter device according to a preferred embodiment of the present invention, the second metal film is made of Al or an alloy including Al as a main component.

In a composite filter device according to a preferred embodiment of the present invention, the first bandpass filter and the second bandpass filter are provided on the same piezoelectric substrate.

A composite filter device according to a preferred embodiment of the present invention, to be used for carrier aggregation includes an antenna common terminal that is connected to an antenna, a first bandpass filter that is connected to the antenna common terminal and has a first pass band, and a second bandpass filter that is connected to the antenna common terminal and has a second pass band of a higher frequency than the first pass band, wherein the first bandpass filter includes a filter portion defining the first pass band, and an elastic wave resonator which is connected to the filter portion at the antenna common terminal side, each of the filter portion and the elastic wave resonator includes an LiNbO$_3$ substrate, an IDT electrode which is provided on the LiNbO$_3$ substrate, and a dielectric film that covers the IDT electrode and includes silicon oxide as a main component, and the elastic wave resonator utilizes a Rayleigh wave propagating in the LiNbO$_3$ substrate and an acoustic velocity of a Sezawa wave in the elastic wave resonator is equal to or higher than about 4643.2 m/sec.

In a composite filter device according to a preferred embodiment of the present invention, a plurality of duplexers connected to the antenna common terminal are provided, each of the duplexers includes a reception filter and a transmission filter, and the first and second bandpass filters are either of the transmission filter or the reception filter of any of the plurality of duplexers. In this case, for example, in the composite filter device for carrier aggregation, it is possible to effectively reduce or prevent an adverse effect of the Sezawa wave in attenuation characteristics of the first bandpass filter.

According to preferred embodiments of the present invention, it is possible to effectively reduce or prevent an adverse effect due to a response of a Sezawa wave on a bandpass filter having a higher frequency band as its pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described reference to the accompanying drawings.

It should be noted that the respective preferred embodiments which are described in the specification are exemplary and partial replacement or combination of components between different preferred embodiments may be made.

Figure 1:
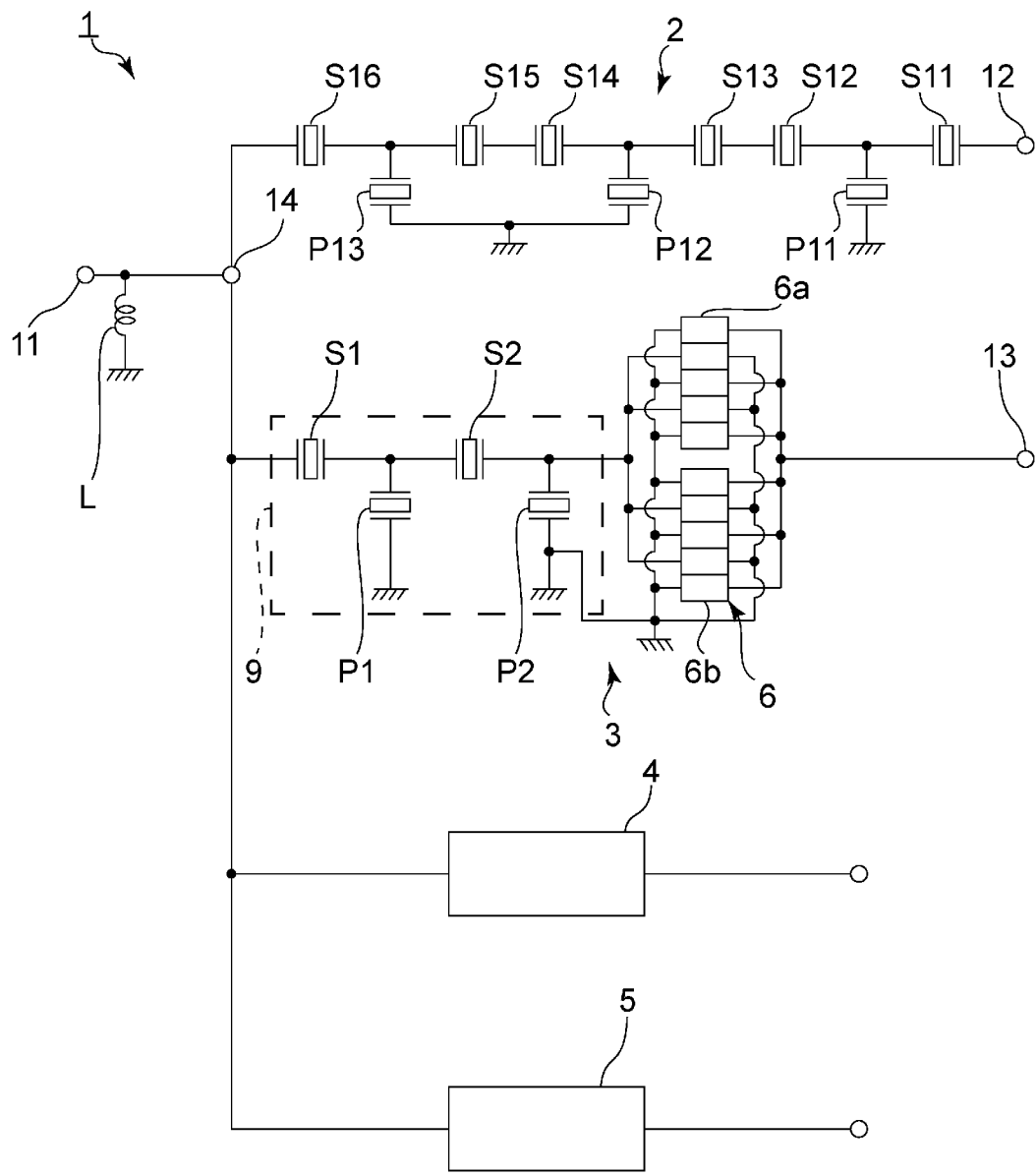
FIG. 1 is a circuit diagram showing a composite filter device according to a first preferred embodiment of the present invention.

FIG. 1 is a circuit diagram of a composite filter device according to a first preferred embodiment of the present invention. A composite filter device 1 of a preferred embodiment of the present invention may be used in a carrier aggregation system.

As shown in FIG. 1, the composite filter device 1 includes first to fourth bandpass filters 2 to 5. In FIG. 1, the third and fourth bandpass filters 4 and 5 are schematically illustrated in blocks. The first to fourth bandpass filters 2 to 5 are provided to support a plurality of carriers, that is, a plurality of communication schemes.

The composite filter device 1 includes the first bandpass filter 2 and the second bandpass filter 3. The composite filter device 1 includes an antenna terminal 11. An antenna common terminal 14 is connected to the antenna terminal 11. An impedance matching inductor L is connected between the antenna common terminal 14 and a reference potential.

Of the first to fourth bandpass filters 2 to 5, the first bandpass filter 2 is a reception filter of a certain Band and the second bandpass filter 3 is a reception filter of a Band which is different from that of the first bandpass filter 2. The pass band the second bandpass filter 3 is set to be higher than the pass band of the first bandpass filter 2. The third and fourth bandpass filters 4 and 5 are reception filters of Bands which are different from those of both of the first bandpass filter 2 and the second bandpass filter 3.

The first bandpass filter 2 is connected between the antenna common terminal 14 and the reception terminal 12. The second bandpass filter 3 is connected between the antenna common terminal 14 and a reception terminal 13.

The pass band of the second bandpass filter 3 is at the high-frequency side relative to the pass band of the first bandpass filter 2.

In the present preferred embodiment, the first bandpass filter 2 includes a plurality of series arm resonators S11 to S16 and a plurality of parallel arm resonators P11 to P13. Each of the plurality of series arm resonators S11 to S16 and the plurality of parallel arm resonators P11 to P13 is preferably an elastic wave resonator. A structure of following specific elastic wave resonator will be described using the series arm resonator S11 as a representative example. The first bandpass filter 2 includes an IDT electrode and an SiO$_2$ film that are laminated on an LiNbO$_3$ substrate. A Rayleigh wave propagating in the LiNbO$_3$ substrate is utilized.

In the present preferred embodiment, the series arm resonators S11 to S16 and the parallel arm resonators P11 to P13 are defined by specific elastic wave resonators, which will be described below, and an effect of a Sezawa wave is thus effectively reduced or prevented. This will be described in more detail below.

Figure 2A:
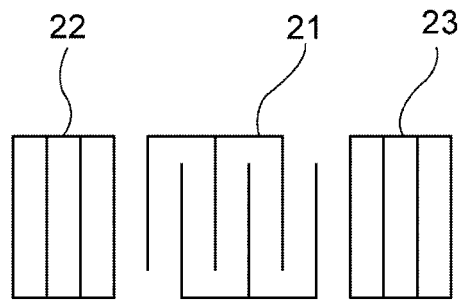
FIGS. 2A and 2B are a schematic plan views showing an electrode structure of an elastic wave resonator which is used in the first preferred embodiment of the present invention and a schematic partial cutaway front cross-sectional view for explaining a depth direction angle ψ(°) of propagation of a fast transversal wave with respect to a main surface of an LiNbO$_3$ substrate of the elastic wave resonator.

FIG. 2A is a schematic plan view showing an electrode structure of the elastic wave resonator defining the series arm resonator S11 of the first bandpass filter 2. As shown in FIG. 2A, reflectors 22 and 23 are provided at both sides of an IDT electrode 21 in the elastic wave propagation direction. Thus, a one port elastic wave resonator is provided.

Figure 2B:
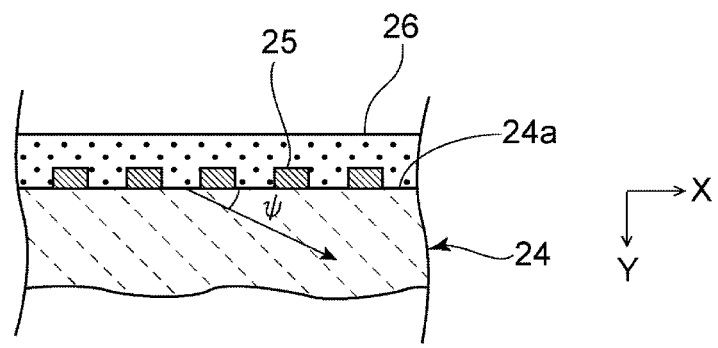

FIG. 2B is a schematic partial cutaway front cross-sectional view for explaining a depth direction angle ψ of the fast transversal wave propagating in the LiNbO$_3$ substrate in the one port elastic wave resonator. As shown in FIG. 2B, an IDT electrode 25 is provided on an LiNbO$_3$ substrate 24. An SiO$_2$ film 26 is laminated to cover the IDT electrode 25. By laminating the SiO$_2$ film 26, an absolute value of a frequency temperature coefficient is reduced.

Figure 3:
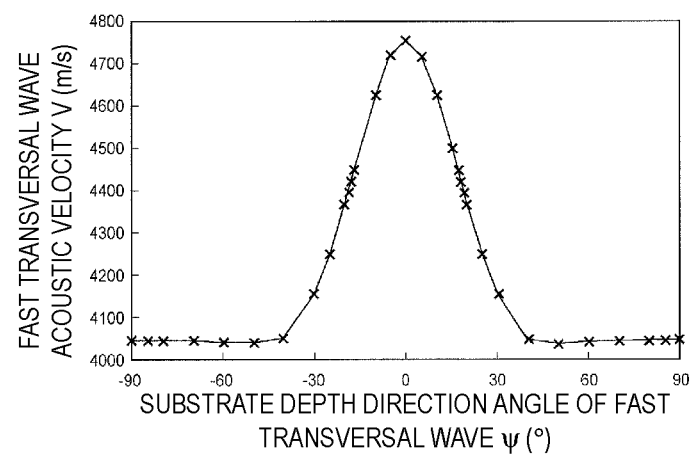
FIG. 3 is a graph showing a relationship between the substrate depth direction angle ψ(°) of the fast transversal wave and a fast transversal wave acoustic velocity.

When an AC voltage is applied to the IDT electrode 25, an elastic wave, such as a Rayleigh wave, for example, is excited. In this case, not only the Rayleigh wave but also the Sezawa wave which is a higher-order mode thereof is excited. Further, a fast transversal wave is also excited. The fast transversal wave or a bulk wave propagates from a main surface 24a of the LiNbO$_3$ substrate 24 into the LiNbO$_3$ substrate 24. Here, the depth direction angle ψ of the fast transversal wave with respect to the main surface 24a of the LiNbO$_3$ substrate 24 is defined as shown in FIG. 2B. In other words, when the fast transversal wave propagates in the direction of an arrow, the depth direction angle ψ is an angle between the traveling direction of the fast transversal wave and the main surface 24a of the LiNbO$_3$ substrate 24. FIG. 3 is a graph showing a relationship between the substrate depth direction angle ψ of the fast transversal wave and a fast transversal wave acoustic velocity. As is apparent from FIG. 3, the fast transversal wave acoustic velocity is increased in the vicinity of the substrate depth direction angle ψ of about 0°. Furthermore, the fast transversal wave acoustic velocity is decreased as the substrate depth direction angle ψ is increased from about 0° to about 40°.

Figure 4:
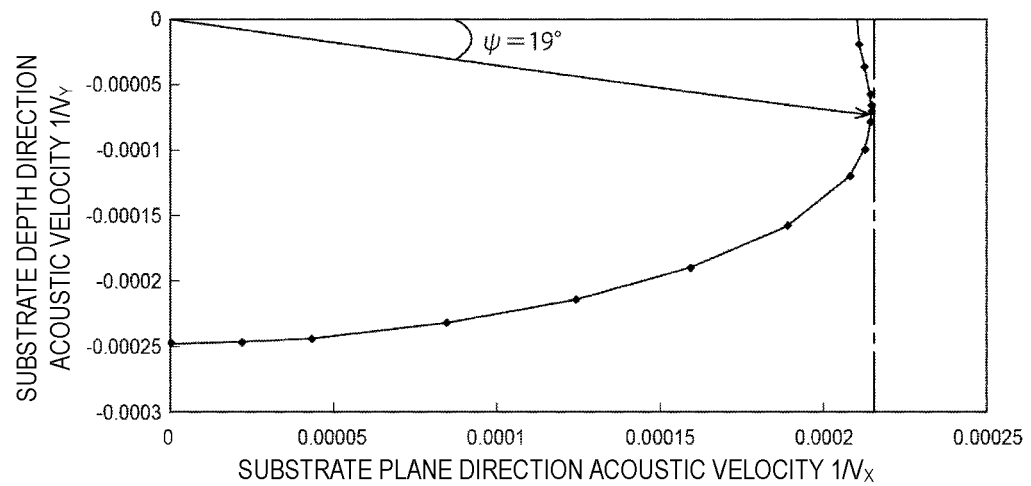
FIG. 4 is a diagram showing a relationship between an inverse 1/V$_X$ of an acoustic velocity of the fast transversal wave along a substrate plane direction and an inverse 1/V$_Y$ of an acoustic velocity along a substrate depth direction.

Based on the relationship between the depth direction angle ψ and the fast transversal wave acoustic velocity, which is shown in FIG. 3, an inverse acoustic velocity plane of the fast transversal wave acoustic velocity is calculated. FIG. 4 shows a calculation result of the inverse acoustic velocity plane. As shown in FIG. 2B, in the main surface 24a of the LiNbO$_3$ substrate 24, a direction in which the elastic wave is excited is defined as X and a depth direction of the LiNbO$_3$ substrate 24 is defined as Y. In FIG. 4, a horizontal axis represents an inverse $1/V_X$ of the acoustic velocity along the substrate plane direction and a vertical axis represents an inverse $1/V_Y$ of the acoustic velocity along the substrate depth direction. Here, $1/V_X$ and $1/V_Y$ are obtained from the inverse $1/V$ of the fast transversal wave acoustic velocity V shown in FIG. 3 and the depth direction angle ψ. That is, the following $1/V_X$ and $1/V_Y$ are obtained from (1/V) and ψ.

$$1/V_X=(1/V)\times\cos\psi°$$

$$1/V_Y=(1/V)\times\sin\psi°$$

$1/V_X$ is the inverse of the acoustic velocity of the fast transversal wave in the direction of the main surface 24a and $1/V_Y$ is the inverse of the acoustic velocity thereof in the direction orthogonal to the main surface 24a. By setting $1/V_X$ and $1/V_Y$ as the X coordinate and the Y coordinate, respectively, as shown in FIG. 4, the inverse acoustic velocity plane can be drawn. As is apparent from FIG. 4, the inverse acoustic velocity plane of the fast transversal wave is not circular with the Euler Angles (0°, about 46.5°, ψ), and therefore, the inverse $1/V_X$ of the acoustic velocity in the direction along the main surface 24a is the largest when ψ is about 19°. In other words, when ψ is about 19°, the acoustic velocity in the direction along the main surface 24a becomes the lowest. This indicates that the Sezawa wave is cut off by the fast transversal wave in the case in which the acoustic velocity of the Sezawa wave becomes higher than the acoustic velocity of the component of the fast transversal wave in the substrate plane direction when ψ is about 19°. The acoustic velocity $V_X$ at which the cutoff occurs is as follows because the fast transversal wave acoustic velocity V when ψ is about 19° is about 4390.2 m/sec.

$$1/V_X=(1/V)\times\cos 19°=(1/4390.2)\times\cos 19°=1/4643.2.$$

Thus, $V_X$=about 4643.2 is satisfied. In other words, in order to efficiently reduce or prevent a response of the unwanted wave caused by the Sezawa wave, it has been discovered that the acoustic velocity Vs of the Sezawa wave should preferably be set to be higher than about 4643.2 m/sec, for example.

Figure 5:
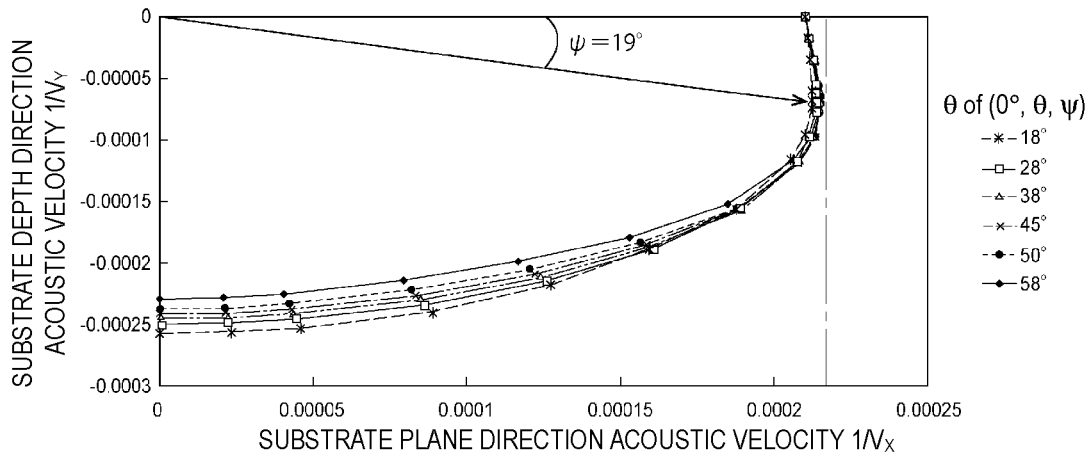
FIG. 5 is a diagram showing a relationship between the inverse 1/V$_X$ of the acoustic velocity along the substrate plane direction and the inverse 1/V$_Y$ of the acoustic velocity along the substrate depth direction when 0 of Euler Angles (0°, θ, ψ) of the LiNbO$_3$ substrate is changed to about 18°, about 28°, about 38°, about 45°, about 50°, and about 58°.

FIG. 5 is a diagram showing an inverse acoustic velocity plane when θ of the Euler Angles (0°, θ, ψ) is set to about 18°, about 28°, about 38°, about 45°, about 50°, or about 58°. As is apparent from FIG. 5, even if θ of the Euler Angles is changed between about 18° and about 58°, the shape of the inverse acoustic velocity plane is not circular with any Euler Angles. In addition, it is understood that with any Euler Angles, the inverse acoustic velocity plane has a shape with a peak when the depth direction angle ψ is about 19°. Accordingly, it can be seen that with any angle θ between about 18° and about 58°, the Sezawa wave leaks to the LiNbO$_3$ substrate when the acoustic velocity Vs of the Sezawa wave becomes higher than the acoustic velocity $V_X$ of the fast transversal wave in the direction along the main surface 24a with ψ of about 19°. In other words, in the range of θ=about 18° to about 58°, by setting the acoustic velocity of the Sezawa wave to be equal to or higher than the lowest acoustic velocity of the fast transversal wave in the depth direction of the substrate, spurious responses caused by the Sezawa wave are efficiently reduced or prevented.

Accordingly, even when LiNbO$_3$ with any Euler Angles in the range of θ=about 18° to about 58° is used, by setting the acoustic velocity of the Sezawa wave in the elastic wave resonator to be equal to or higher than about 4643.2 m/sec, the adverse effect of the Sezawa wave is able to be effectively reduced or prevented.

In the present preferred embodiment, in the first bandpass filter 2, the plurality of series arm resonators S11 to S16 and the plurality of parallel arm resonators P11 to P13 are preferably defined by the elastic wave resonators in which the acoustic velocity of the Sezawa wave is higher than about 4643.2 m/s, for example. Therefore, it is understood that the adverse effect of the response of the Sezawa wave is able to be effectively reduced or prevented in the first bandpass filter 2. Thus, it is preferable that all of the series arm resonators S11 to S16 and the parallel arm resonators P11 to P13 are defined by the elastic wave resonators in which the acoustic velocity of the Sezawa wave is higher than about 4643.2 m/s, for example. However, when at least one of the series arm resonators S11 to S16 and the parallel arm resonators P11 to P13 is defined by the elastic wave resonator in which the acoustic velocity of the Sezawa wave is higher than about 4643.2 m/s, it is possible to effectively reduce or prevent the effect of the Sezawa wave.

In the case in which the Sezawa wave has responses at a plurality of frequency positions or in the case in which the response of the Sezawa wave has a certain frequency range, the frequency of the response of the Sezawa wave is a frequency at which the reflection characteristic of the composite filter device at the input terminal side is maximum.

As described above, it is preferable that the acoustic velocity of the Sezawa wave is equal to or higher than about 4643.2 m/sec, for example, in the series arm resonator S16 closest to the antenna common terminal 14 and the antenna terminal 11. In the composite filter device 1, the first bandpass filter 2 and the second bandpass filter 3 are commonly connected to the antenna common terminal 14 and the antenna terminal 11. Accordingly, it is effective that the acoustic velocity of the Sezawa wave is equal to or higher than about 4643.2 m/sec in the series arm resonator S16 closest to the antenna common terminal 14 and the antenna terminal 11, which provides the largest effect on a mating band when bundled. As a result, it is possible to effectively reduce or prevent an adverse effect on the second bandpass filter 3 and an adverse effect on the first bandpass filter 2 from the second bandpass filter 3.

As shown in FIG. 1, in the second bandpass filter 3, a longitudinally coupled resonator elastic wave filter 6 having 5-IDT elastic wave filters 6a and 6b, for example, is preferably used. The longitudinally coupled resonator elastic wave filter 6 is connected to a ladder filter 9 at the opposite side to the antenna common terminal 14. The ladder filter 9 includes series arm resonators S1 and S2 and parallel arm resonators P1 and P2.

Also in the second bandpass filter 3, preferably, the acoustic velocity of the Sezawa wave is equal to or higher than about 4643.2 m/sec, for example. That is, it is preferable that the acoustic velocity of the Sezawa wave is equal to or higher than about 4643.2 m/sec in at least one of the longitudinally coupled resonator elastic wave filter 6, the series arm resonators S1 and S2, and the parallel arm resonators P1 and P2. Preferably, in the series arm resonator S1 closest to the antenna common terminal 14, the acoustic velocity of the Sezawa wave is equal to or higher than about 4643.2 m/sec, for example.

Further, the second bandpass filter 3 may include only the longitudinally coupled resonator elastic wave filter 6. In preferred embodiments of the present invention, the elastic wave resonator in which the acoustic velocity of the Sezawa wave is equal to or higher than about 4643.2 m/sec is assumed to include not only a surface acoustic wave resonator but also a longitudinally coupled resonator elastic wave filter. Therefore, the second bandpass filter in the composite filter device of the present invention may include only the longitudinally coupled resonator elastic wave filter. Further, in the composite filter device 1 shown in FIG. 1, the third bandpass filter 4 having a higher pass band than the second bandpass filter 3 is connected to the antenna common terminal 14. Therefore, for the second bandpass filter 3 and the third bandpass filter 4, it is preferable that the acoustic velocity of the Sezawa wave be set to be equal to or higher than about 4643.2 m/sec, for example, in the elastic wave resonator of the second bandpass filter 3. It is thus possible to effectively reduce or prevent the effect of the second bandpass filter 3 on the third bandpass filter 4. In other words, in the composite filter device 1 having equal to or more than three bandpass filters, which is used in a carrier aggregation system, for example, preferably, the acoustic velocity of the Sezawa wave is equal to or higher than about 4643.2 m/sec, for example, in the elastic wave resonators of the bandpass filters.

In preferred embodiments of the present invention, in the case of the bandpass filter having the plurality of elastic wave resonators, it is sufficient that the acoustic velocity of the Sezawa wave is equal to or higher than about 4643.2 m/sec in at least one elastic wave resonator. Also, as described above, when using the longitudinally coupled resonator elastic wave filter, it is sufficient that the acoustic velocity of the Sezawa wave is equal to or higher than about 4643.2 m/sec in the longitudinally coupled resonator elastic wave filter.

The acoustic velocity Vs of the Sezawa wave is determined as $Vs=\lambda \times Fs$ with a wavelength $\lambda$ determined by an electrode finger pitch of the IDT electrode in the elastic wave resonator or the longitudinally coupled resonator elastic wave filter and the frequency Fs of the Sezawa wave. Here, as for the wavelength $\lambda$ which is determined by the electrode finger pitch, when the electrode finger pitch of the IDT electrode is not constant over the entire IDT electrode, it is sufficient that the wavelength at the largest electrode finger pitch is determined as $\lambda$.

In addition, in the first preferred embodiment, in the elastic wave resonators defining the series arm resonators S11 to S16 of the first bandpass filter 2, the acoustic velocity of the Sezawa wave is preferably set equal to or higher than about 4643.2 m/sec, for example. Preferred embodiments of the present invention may, however, be applied to various bandpass filter devices.

Figure 6:
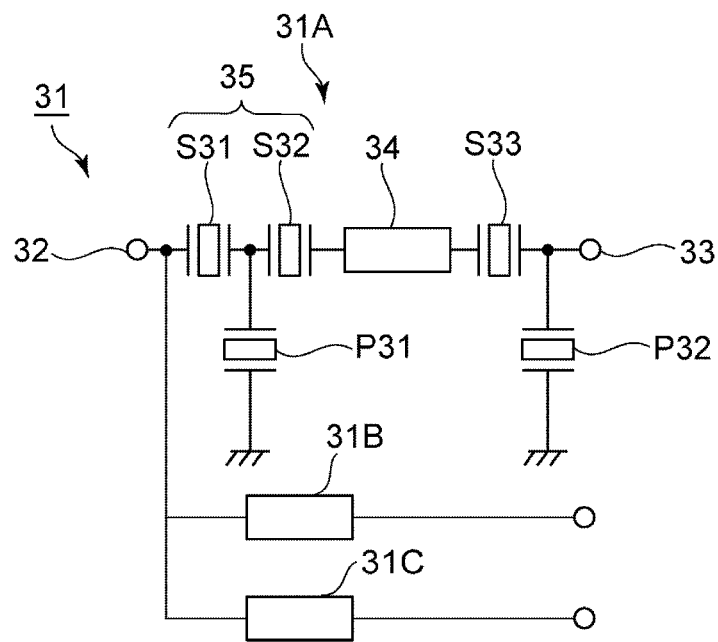
FIG. 6 is a circuit diagram of a composite filter device according to a second preferred embodiment of the present invention.

FIG. 6 is a circuit diagram of a composite filter device according to a second preferred embodiment of the present invention. A composite filter device 31 includes an antenna common terminal 32. A first bandpass filter 31A, a second bandpass filter 31B, and a third bandpass filter 31C are connected to the antenna common terminal 32. The first bandpass filter 31A is a reception filter of Band 3. In the first bandpass filter 31A, a longitudinally coupled resonator elastic wave filter 34 is connected between the antenna common terminal 32 and a reception terminal 33. A ladder filter 35 is connected between the longitudinally coupled resonator elastic wave filter 34 and the antenna common terminal 32. The ladder filter 35 includes series arm resonators S31 and S32 and a parallel arm resonator P31. In the first bandpass filter 31A, a pass band is defined by the longitudinally coupled resonator elastic wave filter 34 and the ladder filter 35. A series arm resonator S33 and a parallel arm resonator P32 are provided between the longitudinally coupled resonator elastic wave filter 34 and the reception terminal 33. The series arm resonator S33 and the parallel arm resonator P32 adjust the pass band.

Figure 7:
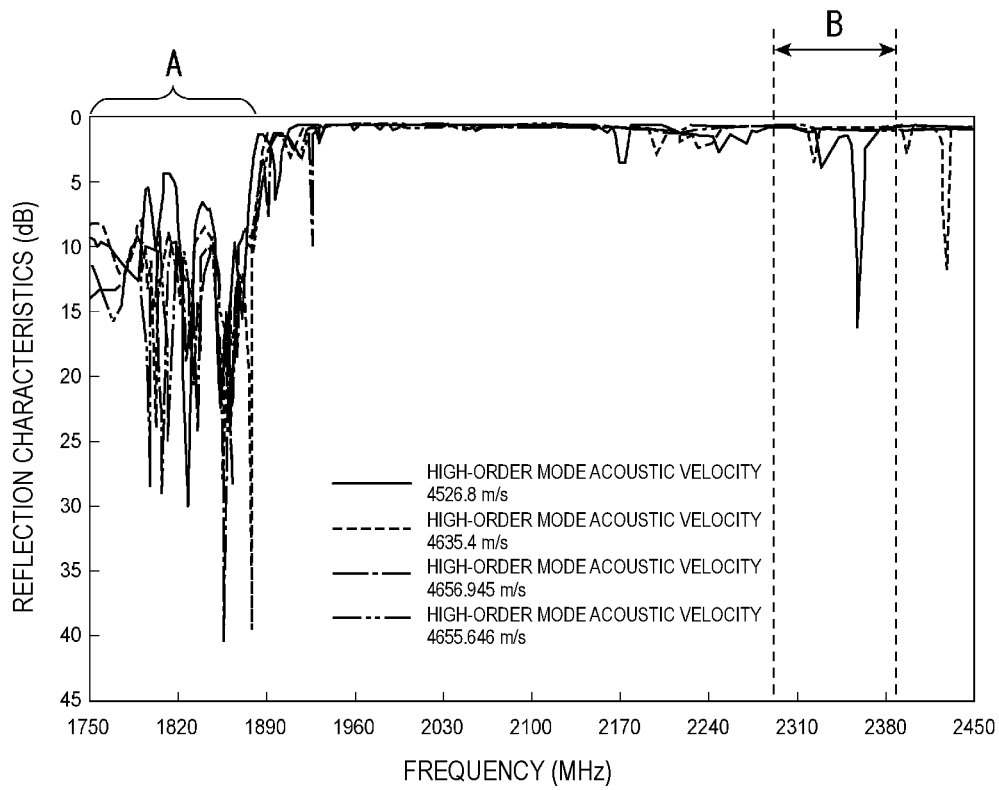
FIG. 7 is a graph showing reflection characteristics of the composite filter device according to the second preferred embodiment of the present invention.

FIG. 7 shows reflection characteristics of the composite filter device 31. The first bandpass filter 31A in the composite filter device 31 is the reception filter of Band 3 and a portion indicated by A is a pass band thereof. In addition, a band indicated by B is a band of a higher-order mode. FIG. 7 shows the reflection characteristics when the acoustic velocity of the high-order mode is set to about 4526.8 m/sec, about 4635.4 m/sec, about 4656.945 m/sec, or about 4655.646 m/sec in the series arm resonator S33 and the parallel arm resonator P32.

As is apparent from FIG. 7, when the acoustic velocity of the high-order mode is set to be equal to or higher than about 4643.2 m/sec, such as about 4656.945 m/sec or about 4655.646 m/sec, a response in the longitudinally coupled resonator elastic wave filter hardly occurs in a band in which the high-order mode is generated.

It is preferable to reduce or prevent responses by the series arm resonators S31 and S32 and a response by the parallel arm resonator P31. Therefore, in this case, it is preferable that the acoustic velocity of the Sezawa wave also be set to equal to or higher than about 4643.2 m/sec in the series arm resonators S31 and S32 and the parallel arm resonator P31.

Figure 8:
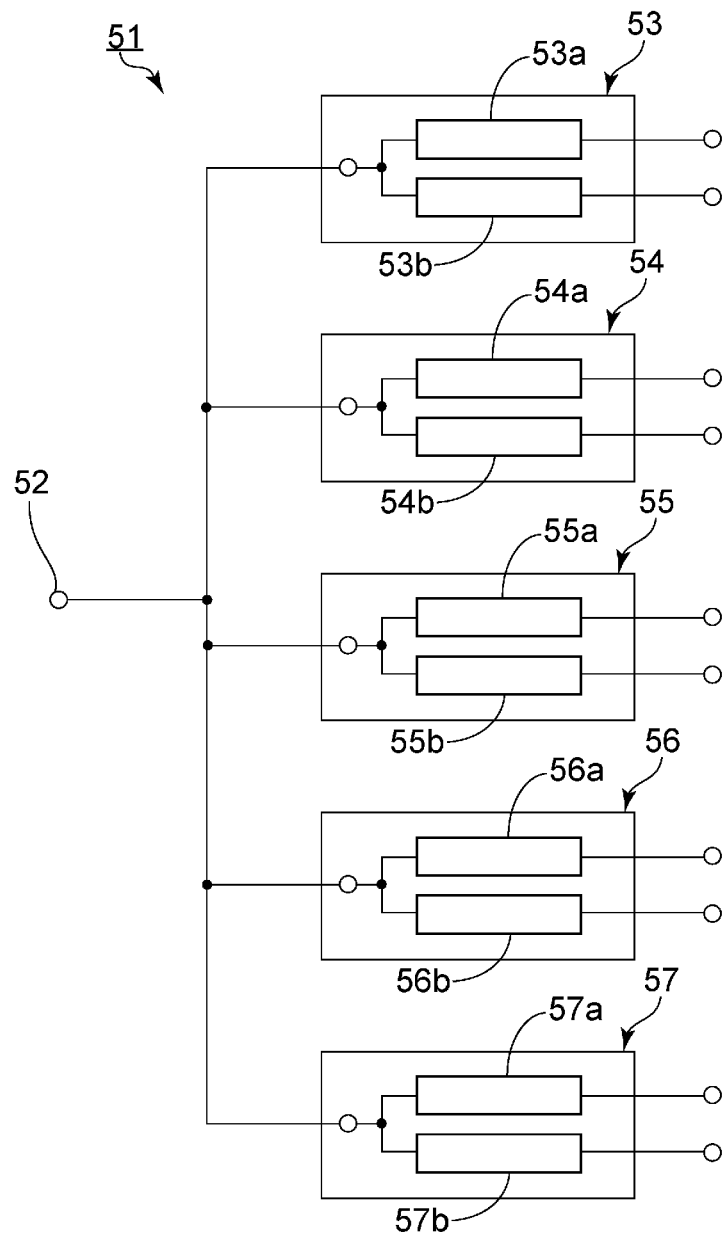
FIG. 8 is a schematic circuit diagram of a composite filter device according to a third preferred embodiment of the present invention.

FIG. 8 is a schematic circuit diagram of a composite filter device according to a third preferred embodiment of the invention. A composite filter device 51 is structured and configured for carrier aggregation. The composite filter device 51 includes an antenna terminal 52 as a common terminal. A plurality of duplexers 53 to 57 are connected to the antenna terminal 52. The duplexers 53 to 57 respectively include transmission filters 53a, 54a, 55a, 56a, and 57a and reception filters 53b, 54b, 55b, 56b, and 57b. In the composite filter device 51, any one of the transmission filters 53a to 57a may be structured and configured as the first bandpass filter according to a preferred embodiment of the present invention and at least one of the remaining transmission filters and the reception filters may be structured as the second bandpass filter according to a preferred embodiment of the present invention. In other words, any one of the plurality of bandpass filters connected to the antenna terminal 52 defining the common terminal may be the first bandpass filter whereas at least one of the other bandpass filters may be the second bandpass filter. Thus, a response by the Sezawa wave in the first bandpass filter is reduced or prevented, and the adverse effect of the response by the Sezawa wave is also able to be effectively reduced or prevented in the second bandpass filter that is commonly connected with the first bandpass filter.

Figure 11:
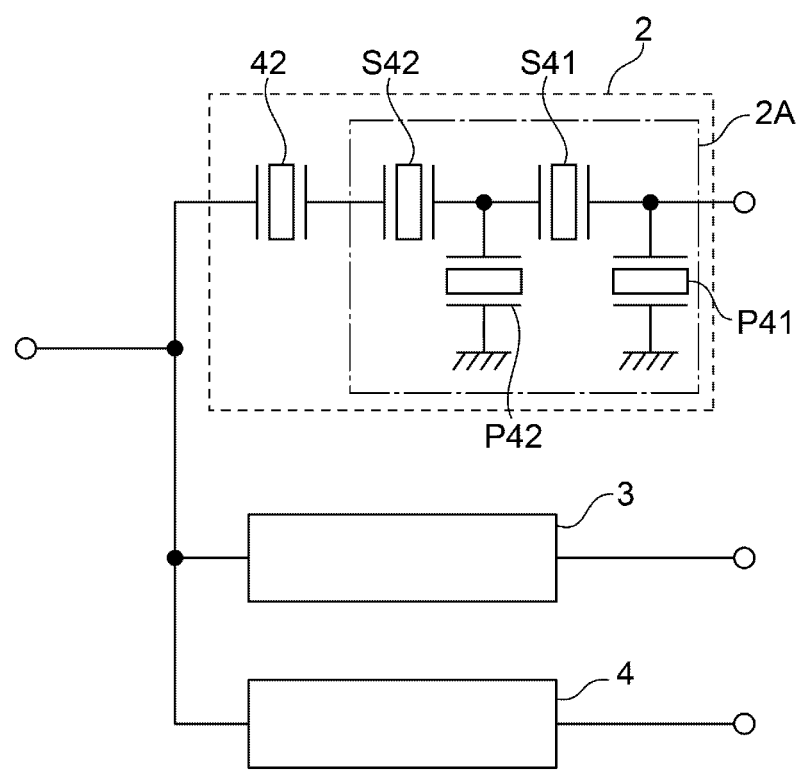
FIG. 11 is a schematic circuit diagram of a composite filter device according to a fourth preferred embodiment of the present invention.

As in a fourth preferred embodiment shown in FIG. 11, the first bandpass filter 2 may include a filter portion 2A and an elastic wave resonator 42 connected to the filter portion 2A at the antenna common terminal side. Here, the filter portion 2A is a ladder filter including series arm resonators S41 and S42 and parallel arm resonators P41 and P42. This filter portion 2A defines a first pass band. The elastic wave resonator 42 does not define the first pass band. As in the first to third preferred embodiments, the filter portion 2A and the elastic wave resonator 42 include LiNbO$_3$ substrates, IDT electrodes provided on the LiNbO$_3$ substrates, and dielectric films including silicon oxide as main components, which cover the IDT electrodes. The elastic wave resonator having such a laminated structure defines each of the series arm resonators S41 and S42 and the parallel arm resonators P41 and P42. The elastic wave resonator 42 also preferably has a similar laminated structure. However, the filter portion 2A may have another structure.

On the other hand, the elastic wave resonator 42 not only has the laminated structure of the LiNbO$_3$ substrate, the IDT electrode, and the dielectric film including silicon oxide as the main component, but also uses a Rayleigh wave, and the acoustic velocity of the Sezawa wave therein is preferably set to be equal to or higher than about 4643.2 m/sec, for example. Therefore, also in the fourth preferred embodiment, since the elastic wave resonator 42 is provided, it is possible to reduce or prevent an adverse effect caused by response of the Sezawa wave as in the first to third preferred embodiments.

In the above-described preferred embodiments, the IDT electrode is preferably made of W, for example, but another metal may be used. Preferably, the IDT electrode includes a first metal film primarily including a metal film made of one of W, Pt, Cu, and Mo. In this case, good filter characteristics with the Rayleigh wave are able to be obtained. It is to be noted that the term "film primarily made of metal" is not limited to "film made of the metal only" and also includes "film including an alloy with the metal content of equal to or higher than 50% by weight".

Figure 9:
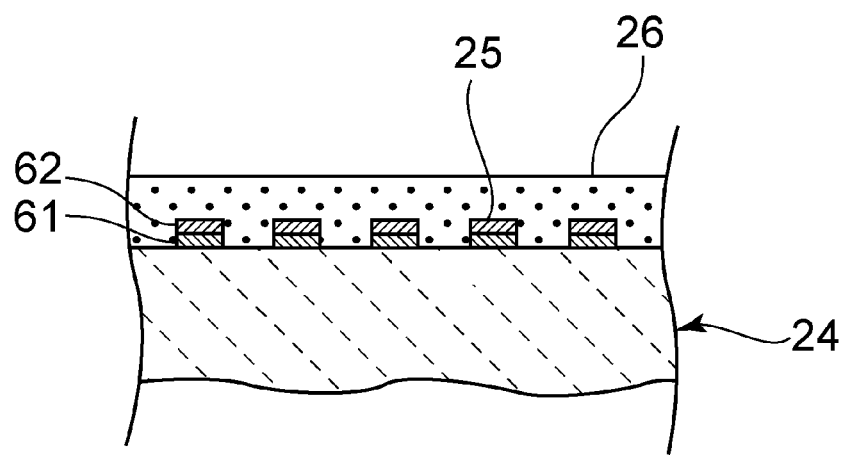
FIG. 9 is a schematic partial front cross-sectional view for explaining a variation on an IDT electrode in a composite filter device according to a preferred embodiment of the present invention.

Further, as shown in FIG. 9, a second metal film 62 having an electric resistance lower than that of a first metal film 61 may be laminated on the first metal film 61. In this case, loss is effectively reduced. As a material of the second metal film 62, an alloy including Al as a main component or a metal of Al is preferably used.

As described above, in the first preferred embodiment to the third preferred embodiment, by setting the acoustic velocity of the Sezawa wave in the elastic resonator to be equal to or higher than about 4643.2 m/sec, the adverse effect due to the response of the Sezawa wave is reduced or prevented. In order to thus set the acoustic velocity of the Sezawa wave to be equal to or higher than about 4643.2 m/sec, the material, the film thickness, and other parameters of the electrode in the elastic wave resonator are adjusted.

Figure 10:
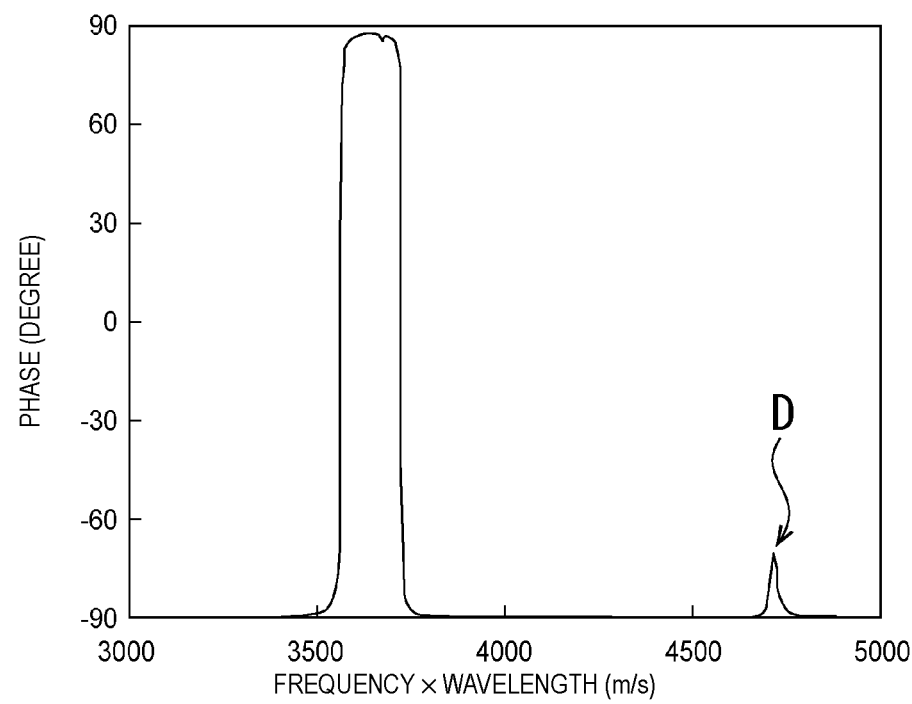
FIG. 10 is a graph showing phase characteristics of an example of an elastic wave resonator which is used in a composite filter device according to a preferred embodiment of the present invention.

FIG. 10 is a diagram showing phase characteristics of an elastic wave resonator of a specific example when an IDT electrode is made of W. In this example, on an LiNbO$_3$ substrate having the Euler Angles (0°, 38°, 0°), an Al film having a wavelength normalized film thickness of about 10%, for example, is preferably laminated on a W film having a wavelength normalized film thickness of about 3%, for example. An SiO$_2$ film having a wavelength normalized film thickness of about 25%, for example, is preferably laminated on the LiNbO$_3$ substrate so as to cover the IDT electrode including the W film and the Al film. Further, an SiN film having a wavelength normalized film thickness of about 1%, for example, is preferably laminated on the SiO$_2$ film. As shown by an arrow D in FIG. 10, with the phase characteristics of the elastic wave resonator having such a laminated structure, a response due to the Sezawa wave is very small.

In addition, in the first preferred embodiment, the SiO$_2$ film 26 covers the IDT electrodes 25, but a dielectric film including silicon oxide as a main component other than the SiO$_2$ film may also be used. The dielectric film including silicon oxide as the main component is not limited to SiO$_2$ and may be a film made of a dielectric material including equal to or higher than about 50% by weight of SiOx (x is an integer).

In addition, as long as the composite filter devices of preferred embodiments of the present invention include the first and second bandpass filters connected to the antenna common terminal, the specific structure and configuration of the filter device is not particularly limited. Accordingly, preferred embodiments of the present invention may provide duplexers, multiplexers, dual filters, carrier aggregation circuits, high-frequency front end circuits, high-frequency front end modules, communication devices, such as cellular phones and smart phones, and other suitable devices, including composite filter devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite filter device to be used for carrier aggregation, the composite filter device comprising:
    an antenna common terminal that is connected to an antenna;
    a first bandpass filter that is connected to the antenna common terminal and has a first pass band; and a second bandpass filter that is connected to the antenna common terminal and has a second pass band of a higher frequency than the first pass band; wherein the first bandpass filter includes:
an $LiNbO_3$ substrate;
an IDT electrode which is provided on the $LiNbO_3$ substrate and defines the first bandpass filter; and
a dielectric film which covers the IDT electrode on the $LiNbO_3$ substrate and includes silicon oxide as a main component;

the first bandpass filter is defined by at least one elastic wave resonator; and a Rayleigh wave propagating in the $LiNbO_3$ substrate is used and an acoustic velocity of a Sezawa wave in the at least one elastic wave resonator is equal to or higher than about 4643.2 m/sec.

2. The composite filter device according to claim 1, wherein
the first bandpass filter is a ladder filter including series arm resonators and parallel arm resonators; and
at least one of the series arm resonators and the parallel arm resonators is defined by the elastic wave resonator.

3. The composite filter device according to claim 2, wherein at least one of the series arm resonators is defined by the elastic wave resonator.

4. The composite filter device according to claim 2, wherein the ladder filter is connected to the antenna common terminal, and the series arm resonator closest to the antenna common terminal is defined by the elastic wave resonator.

5. The composite filter device according to claim 2, wherein the first bandpass filter further includes a longitudinally coupled resonator elastic wave filter connected to the ladder filter.

6. The composite filter device according to claim 5, wherein the longitudinally coupled resonator elastic wave filter is connected to the ladder filter at an opposite side to the antenna common terminal.

7. The composite filter device according to claim 6, wherein the first bandpass filter further includes another ladder filter connected to the longitudinally coupled resonator elastic wave filter defining the elastic wave resonator at an opposite side to the ladder filter.

8. The composite filter device according to claim 5, wherein the longitudinally coupled resonator elastic wave filter is connected to the ladder filter at an opposite side to the antenna common terminal.

9. The composite filter device according to claim 1, wherein the first bandpass filter includes a longitudinally coupled resonator elastic wave filter defining the elastic wave resonator.

10. The composite filter device according to claim 1, wherein the IDT electrode includes a first metal film including, as a main component, one metal among W, Pt, Cu, and Mo.

11. The composite filter device according to claim 10, further comprising a second metal film which is laminated on the first metal film and has a lower electric resistance than the first metal film.

12. The composite filter device according to claim 11, wherein the second metal film is made of Al or an alloy including Al as a main component.

13. The composite filter device according to claim 1, wherein the first bandpass filter and the second bandpass filter are provided on a same piezoelectric substrate.

14. The composite filter device according to claim 1, wherein a third bandpass filter is further connected to the first bandpass filter at an opposite side to the antenna common terminal.

15. The composite filter device according to claim 1, further comprising:
a plurality of duplexers connected to the antenna common terminal; wherein
each of the plurality of duplexers includes a reception filter and a transmission filter, and the first and second bandpass filters are either of the transmission filter or the reception filter of any of the plurality of duplexers.

16. The composite filter device according to claim 15, wherein
the first bandpass filter is a ladder filter including series arm resonators and parallel arm resonators; and
at least one of the series arm resonators and the parallel arm resonators is defined by the elastic wave resonator.

17. The composite filter device according to claim 16, wherein at least one of the series arm resonators is defined by the elastic wave resonator.

18. The composite filter device according to claim 16, wherein the ladder filter is connected to the antenna common terminal, and the series arm resonator closest to the antenna common terminal is defined by the elastic wave resonator.

19. The composite filter device according to claim 16, wherein the first bandpass filter further includes a longitudinally coupled resonator elastic wave filter connected to the ladder filter.

20. A composite filter device to be used for carrier aggregation, the composite filter device comprising:
an antenna common terminal that is connected to an antenna;
a first bandpass filter that is connected to the antenna common terminal and has a first pass band; and
a second bandpass filter that is connected to the antenna common terminal and has a second pass band of a higher frequency than the first pass band; wherein
the first bandpass filter includes a filter portion defining the first pass band, and an elastic wave resonator which is connected to the filter portion at the antenna common terminal side, each of the filter portion and the elastic wave resonator includes an $LiNbO_3$ substrate, an IDT electrode which is provided on the $LiNbO_3$ substrate, and a dielectric film which covers the IDT electrode and includes silicon oxide as a main component; and
the elastic wave resonator utilizes a Rayleigh wave propagating in the $LiNbO_3$ substrate and a sound velocity of a Sezawa wave in the elastic wave resonator is equal to or higher than about 4643.2 m/sec.

* * * * *